United States Patent
Cohen et al.

(10) Patent No.: US 7,060,585 B1
(45) Date of Patent: Jun. 13, 2006

(54) HYBRID ORIENTATION SUBSTRATES BY IN-PLACE BONDING AND AMORPHIZATION/TEMPLATED RECRYSTALLIZATION

(75) Inventors: Guy Moshe Cohen, Mohegan Lake, NY (US); Katherine L. Saenger, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/058,773

(22) Filed: Feb. 16, 2005

(51) Int. Cl.
*H01L 21/762* (2006.01)
(52) U.S. Cl. ........................ 438/355; 438/407
(58) Field of Classification Search ........ 257/E21.131, 257/E21.133, 365, 506; 438/355, 407, FOR. 222; 117/8
See application file for complete search history.

(56) References Cited

U.S. PATENT DOCUMENTS

| | | | | |
|---|---|---|---|---|
| 3,900,345 A | * | 8/1975 | Lesk | ........................ 117/8 |
| 4,240,843 A | * | 12/1980 | Celler et al. | ................. 438/530 |
| 4,757,030 A | * | 7/1988 | Galvin et al. | ................... 117/8 |
| 4,853,342 A | * | 8/1989 | Taka et al. | ................... 438/283 |
| 5,266,504 A | * | 11/1993 | Blouse et al. | ................ 438/364 |

* cited by examiner

*Primary Examiner*—George Fourson
(74) *Attorney, Agent, or Firm*—Scully, Scott, Murphy & Presser, P.C.; Robert M. Trepp

(57) ABSTRACT

A method utilizing in-place bonding and amorphization/templated recrystallization (ATR) is provided for making bulk and semiconductor-on-insulator substrates having coplanar semiconductor layers of different crystallographic orientations. First and second semiconductor layers having different orientations are bonded to opposite sides of a sacrificial spacer layer. Selected areas in one of the semiconductor layers are amorphized; in-place bonding is then performed in a wet etch solution to remove the sacrificial layer and leave the semiconductor layers bonded to each other. The amorphized regions are recrystallized across the bonded interface, using the semiconductor on the non-amorphized side of the bonded interface as a template.

19 Claims, 12 Drawing Sheets

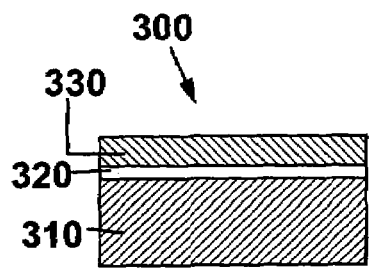
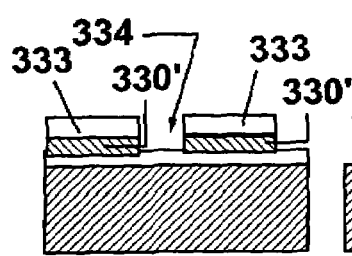
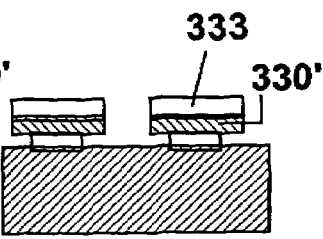
FIG 5A   FIG 5B   FIG 5C
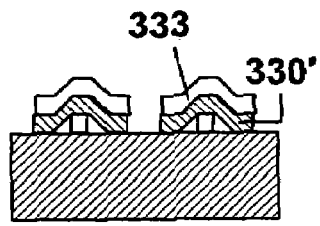
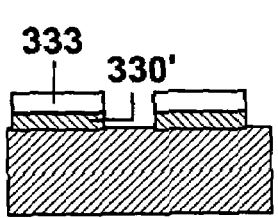
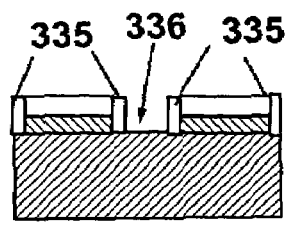
FIG 5D   FIG 5E   FIG 5F
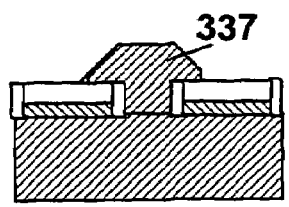
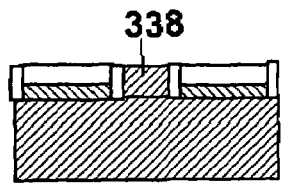
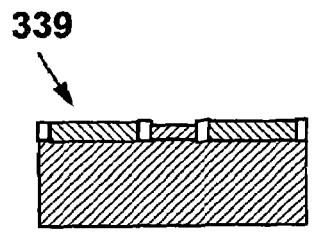
FIG 5G   FIG 5H   FIG 5I

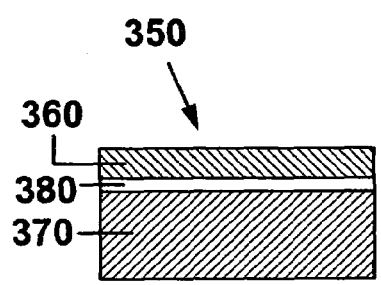
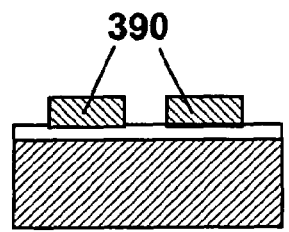
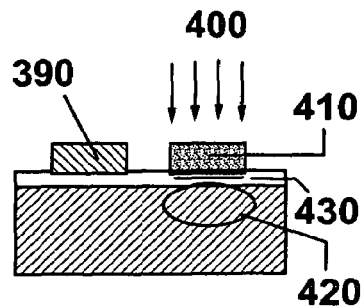
FIG 6A  FIG 6B  FIG 6C
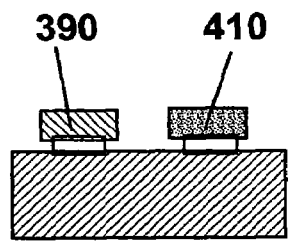
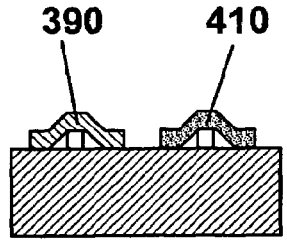
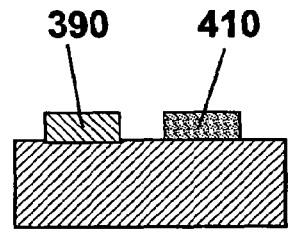
FIG 6D  FIG 6E  FIG 6F
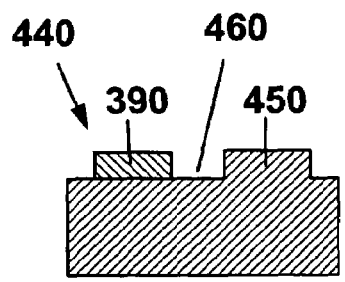
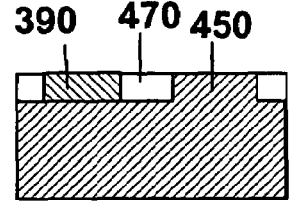
FIG 6G  FIG 6H

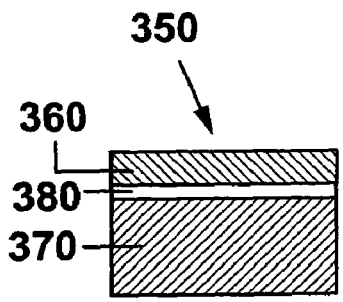
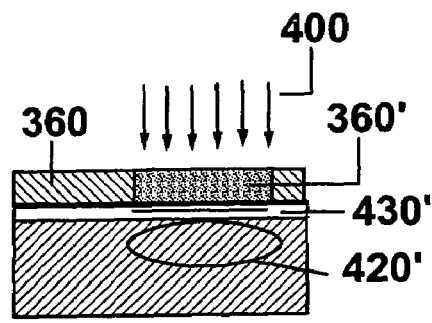
FIG 7A  FIG 7B
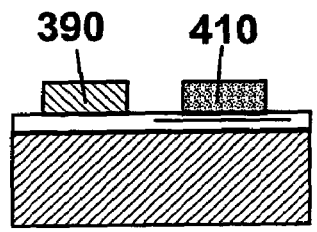
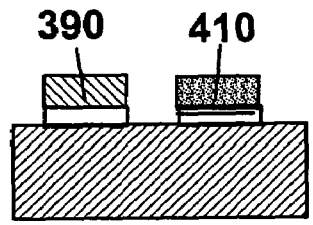
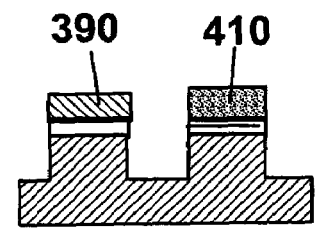
FIG 7C  FIG 7D  FIG 7E
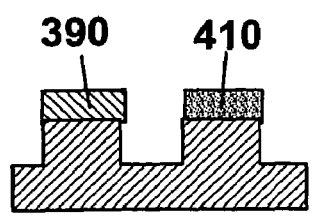
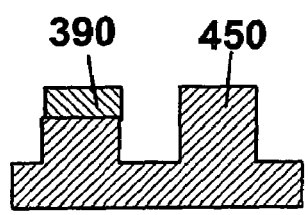
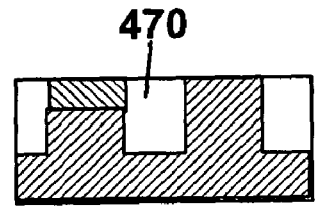
FIG 7F  FIG 7G  FIG 7H

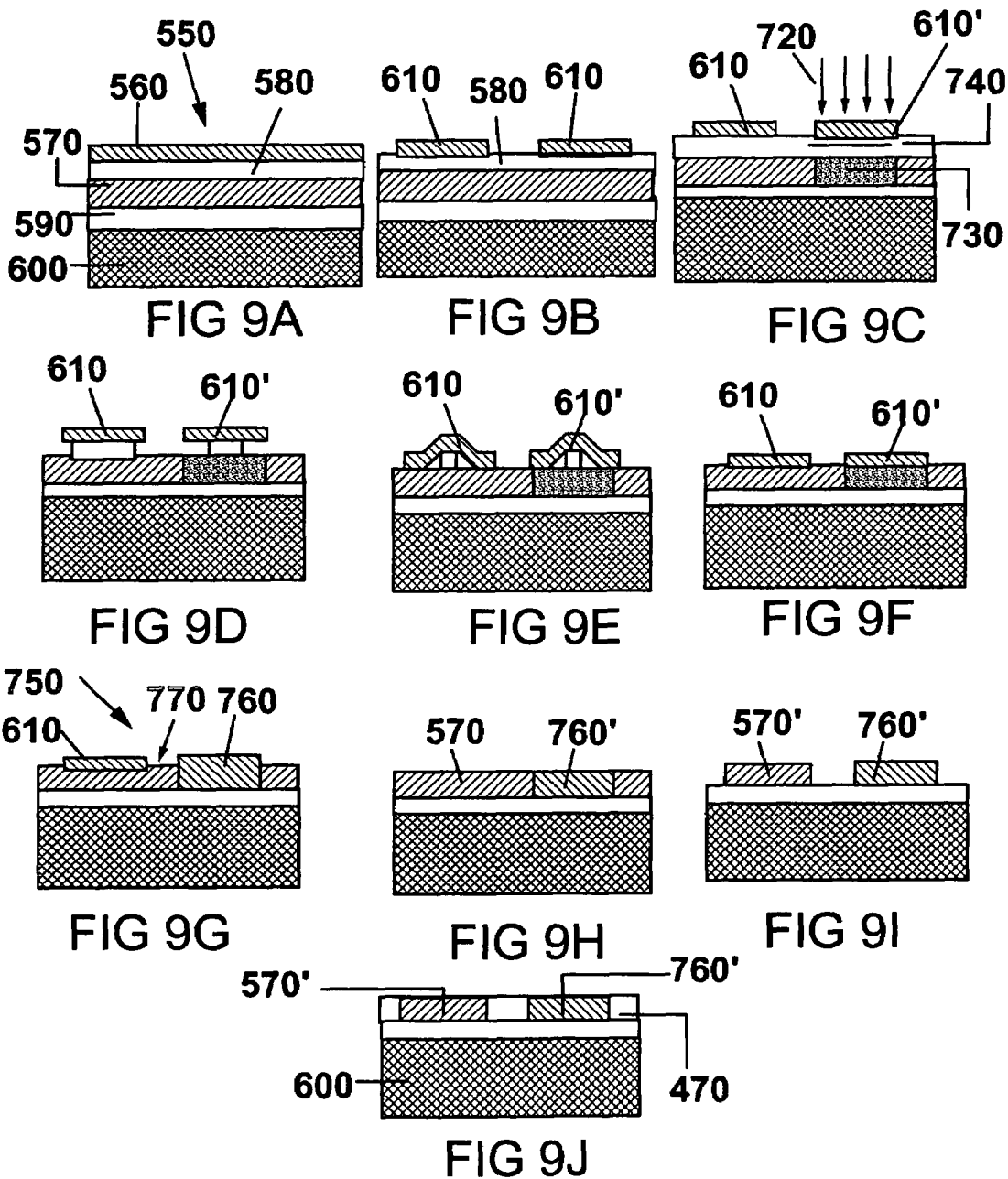

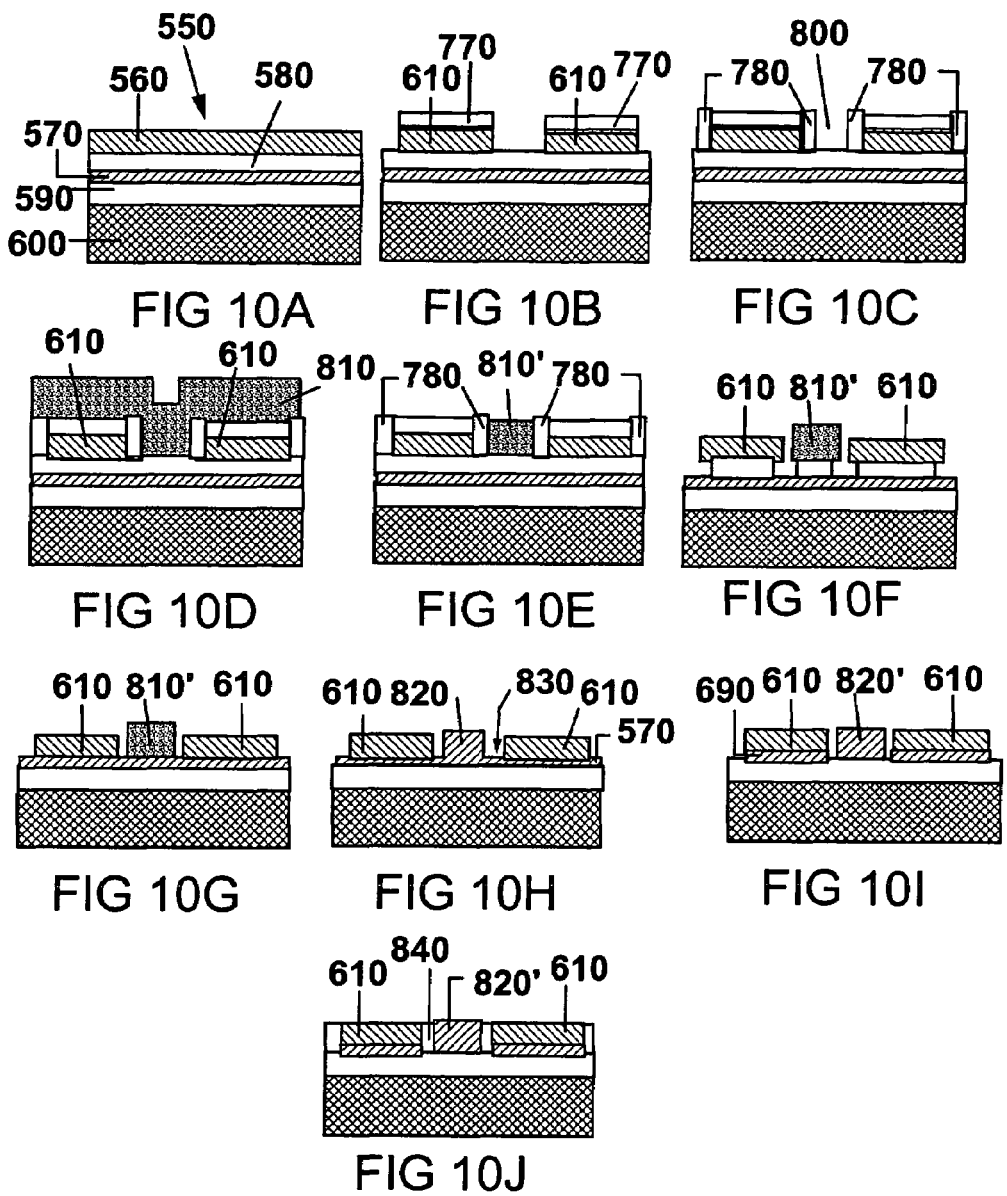

HYBRID ORIENTATION SUBSTRATES BY IN-PLACE BONDING AND AMORPHIZATION/TEMPLATED RECRYSTALLIZATION

RELATED APPLICATIONS

This application is related to pending U.S. application Ser. No. 10/725,850, filed Dec. 2, 2003, entitled "Planar substrate with selected semiconductor crystal orientations formed by localized amorphization and recrystallization of stacked template layers," the content of which is incorporated by reference. Likewise, this application is related to U.S. application Ser. No. 10/978,551, filed Nov. 1, 2004, entitled "In-place bonding of microstructures," the content of which is also incorporated herein by reference.

FIELD OF THE INVENTION

The present invention relates to high-performance complementary metal oxide semiconductor (CMOS) circuits in which carrier mobility is enhanced by utilizing different semiconductor surface orientations for p-type field effect transistors (FETs) and n-type FETs. More particularly, the present invention relates to methods for fabricating planar substrate structures with different surface crystal orientations, and to the hybrid orientation substrate structures produced by such methods.

BACKGROUND OF THE INVENTION

CMOS circuits of current semiconductor technology comprise n-type FETs (nFETs), which utilize electron carriers for their operation, and p-type FETs. (pFETs), which utilize hole carriers for their operation. CMOS circuits are typically fabricated on semiconductor wafers having a single crystal orientation. In particular, most of today's semiconductor devices are built on Si having a (100) surface orientation.

It is known that electrons have a high mobility in Si with a (100) surface orientation and that holes have a high mobility in Si with a (110) surface orientation. In fact, hole mobility can be about 2.5 times higher on a 110-oriented Si wafer than on a standard 100-oriented Si wafer. It would therefore be desirable to create hybrid orientation substrates comprising 100-oriented Si (where nFETs would be formed) and 110-oriented Si (where pFETs would be formed).

Amorphization/templated recrystallization (ATR) is one prior art approach for providing such planar hybrid orientation substrates. FIGS. 1A–1C and 2A–2D outline examples of ATR methods described in U.S. application Ser. No. 10/725,850 for producing hybrid orientation silicon substrates. Specifically, FIGS. 1A–1C outline an ATR method for forming a bulk semiconductor hybrid orientation substrate. FIG. 1A shows starting substrate 10 comprising a first single crystal semiconductor substrate 20 having a first crystal orientation in direct contact with an upper second single crystal semiconductor layer 30 having a second crystal orientation different from the first. The interface 40, which is located between the semiconductor layers 20 and 30, is typically formed by a hydrophobic wafer bonding process. See, for example, Q. -Y. Tong and U. Gosele in Semiconductor Wafer Bonding, John Wiley, 1999.

FIG. 1B shows the structure of FIG. 1A being subjected to ion bombardment 50 in selected areas to create localized amorphized regions 60 extending from the top surface of semiconductor layer 30 to a depth ending in substrate layer 20 below interface 40. FIG. 1C shows the structure of FIG. 1B after localized amorphized regions 60 have been recrystallized (using semiconductor layer 20 as a template) to form single crystal semiconductor region 70 with the orientation of first semiconductor 20. Resulting substrate 80 now comprises two clearly defined single-crystal semiconductor regions with different surface orientations, i.e., non-amorphized regions 30' of the second semiconductor and amorphized/recrystallized regions 70.

FIGS. 2A–2D outline an example of another prior art ATR method for producing a semiconductor-on-insulator (SOI) hybrid orientation substrate. FIG. 2A shows a starting substrate 90 comprising handle substrate 100, insulator layer 110, and a lower first single crystal semiconductor layer 120 having a first crystal orientation in direct contact with an upper second single crystal semiconductor layer 130 having a second crystal orientation different from the first. The interface 140 between semiconductor layers 130 and 120 is typically formed by a hydrophobic wafer bonding process.

FIG. 2B shows the structure of FIG. 2A being subjected to ion bombardment 150 in selected areas to create localized amorphized regions 160 extending from the top surface of insulator 110 up to a depth ending in semiconductor layer 130 above interface 140. FIG. 2C shows the structure of FIG. 2B after localized amorphized regions 160 have been recrystallized (using semiconductor layer 130 as a template) to form single crystal semiconductor region 170 with the orientation of upper semiconductor 130. Upper semiconductor layer 130 is then removed (by a process such as polishing and/or oxidation/wet etching) to produce substrate 180 of FIG. 2D. Substrate 180 comprises two clearly defined single-crystal semiconductor regions with different surface orientations, i.e., non-amorphized regions 120' of the second semiconductor and amorphized/recrystallized regions 170, on buried insulator 110. Regions 170 and 120' may be further thinned (again by processes such as polishing and/or oxidation/wet etching), if thinner semiconductor-on-insulators are desired.

It should be noted that the methods of FIGS. 1A–1C and 2A–2D do not show the additional steps that might be included to minimize the possibility of lateral templating. The sides of the region(s) 60 in FIG. 1B and 160 in FIG. 2B selected for amorphization and templated recrystallization would typically be at least partially isolated from adjacent crystalline regions by structures-such as trenches. The trenches may be formed and filled before amorphization, formed and filled between amorphization and recrystallization, or formed after amorphization and filled after recrystallization. Trench formation would typically be effected by a process such as reactive ion etching (RIE) through a mask.

Like all ATR methods to date, the process flows of FIGS. 1A–1C and 2A–2D utilize the following sequence of steps to change the orientation of selected semiconductor regions from an original orientation to a desired orientation:

(a) forming a bilayer template layer stack comprising a first, lower single crystal semiconductor layer (or substrate) directly in contact with a second, upper (typically bonded) single crystal semiconductor layer, said first semiconductor having a first orientation and said second semiconductor having a second orientation different from the first;

(b) amorphizing one of the layers of the bilayer template stack in selected areas (by ion implantation through a mask, for example) to form localized amorphized regions; and (c) recrystallizing the localized amorphized regions using the non-amorphized layer of the stack as a template, thereby changing the orientation of the semiconductor in the localized amorphized regions from its original orientation to a desired orientation.

A potential problem with this way of implementing ATR is that the ion implant methods typically used for amorphization leave a damaged crystalline layer between the amorphized and the non-amorphized regions of the bilayer template stack. For the case of top amorphization and bottom templating (illustrated in the process flow of FIGS. 1A–1C), the damage layer is commonly referred to as an end-of-range (EOR) damage layer. This EOR damage layer interferes with the clean recrystallization of the amorphized region, both by introducing threading defects (that can propagate to the wafer's surface) and by leaving a band of dislocation loops at the position of the original damage layer. These various damaged regions and defects are illustrated in FIGS. 3A–3C. Specifically, FIG. 3A shows initial substrate 200 with bottom single crystal semiconductor layer 210 and top single crystal semiconductor layer 220 being subjected to an amorphizing ion implant 230. FIG. 3B shows the resulting amorphized region 240 and damaged crystalline region 250, and FIG. 3C shows the loops 260 and threads 270 remaining after a recrystallization anneal.

The amount of EOR damage depends somewhat on the ion implant conditions used for the amorphization. Typically, EOR damage can be reduced by implanting at low temperature (e.g., at liquid nitrogen temperature, 77K, rather than room temperature), by using heavier ions (e.g., Ge ions rather than Si ions), and with shallower implants. However EOR damage (or "beginning-of-range" damage for the case of top templating and bottom amorphization, when ion implantation is used to form a buried amorphous layer) is a characteristic of all ion implantation processes and is very difficult to avoid.

An additional difficulty with previous ATR methods of forming hybrid orientation substrates is that they require direct semiconductor-to-semiconductor (typically Si-to-Si) bonding. This is normally achieved with hydrophobic bonding, a bonding technique that is more difficult and less well developed than the more commonly used hydrophilic bonding. Hydrophobic (H-terminated) surfaces are more easily contaminated than hydrophilic ones, often leading to a choice to perform hydrophobic bonding in a vacuum environment. In addition, the widely used surface plasma treatments developed to allow room temperature bonding typically introduce surface oxygen, making them incompatible with an oxide-free bonded interface. Bonding at higher temperatures also can present difficulties, since most cleaving processes (used to separate the bonded layer from the wafer to which it was originally attached) are thermally activated and start occurring in the same temperature range as the bonding.

A new in-place bonding technique disclosed in U.S. application Ser. No. 10/978,551 provides an alternative route to the traditional direct Si-to-Si bonding described above. A basic embodiment of this technique is illustrated in FIGS. 4A–4E, which show the steps needed for forming Si mesas having a first orientation directly on a Si substrate having a second orientation. Specifically, FIG. 4A shows starting substrate 300 comprising lower single crystal semiconductor layer 310 having a first orientation, sacrificial spacer layer 320 (typically composed of $SiO_2$), and upper single crystal semiconductor layer 330 having a second orientation different from the first. Upper semiconductor layer 330 is then patterned into island(s) 330', as shown in FIG. 4B. In-place bonding between the semiconductor islands 330' and the semiconductor substrate layer 310 is accomplished by gradually removing the spacer layer 320 in a wet etch solution that leaves the underside of semiconductor island 330' and the top surface of the substrate layer 310 hydrophobic and strongly attracted to each other. As the spacer layer material 320 under island 330' becomes more and more undercut (FIG. 4C), the island edges start to bond to the underlying semiconductor layer, as shown in FIG. 4D. The process is complete when the spacer layer is gone and the entire underside of each island is in direct contact with the underlying semiconductor substrates layer, as shown in FIG. 4E. However, hybrid orientation substrates formed by this technique have the drawback that they are inherently non-planar (since the semiconductor island 330' is higher than the exposed regions of semiconductor 310 adjacent to the island).

While the basic process shown in FIGS. 4A–4E could, in principle, be modified and extended to achieve planar hybrid orientation substrates, these additional steps would come at the cost of substantial process complexity. FIGS. 5A–5I show one such example: a modification of the FIG. 4 process combined with a variation of a prior art epitaxial growth method described in U.S. application Ser. Nos. 10/696,634 and 10/250,241. FIG. 5A shows starting substrate 300 comprising lower single crystal semiconductor layer 310 having a first orientation, sacrificial spacer layer 320 (typically composed of $SiO_2$), and upper single crystal semiconductor layer 330 having a second orientation different from the first. FIG. 5B shows upper semiconductor layer 330 after it has been patterned using hard mask structures 333 to produce semiconductor features 330' and exposed regions 334 of sacrificial spacer 320. Hard mask features 333 are preferably formed from an insulating material such as $SiO_2$ or silicon nitride. FIGS. 5C–5E show the progressive stages of in-place bonding that conclude when the entire undersides of semiconductor structures 330' are in direct contact with semiconductor layer 310, as shown in FIG. 5E. FIG. 5F shows the structure of FIG. 5E after formation of insulating sidewall spacers 335, preferably composed of a material such as $SiO_2$ or silicon nitride. Cavity 336 between sidewall spacers 335 is then filled and slightly overfilled with single crystal semiconductor 337, grown by a selective epitaxial growth process (templating from the bottom of cavity 336), as shown in FIG. 5G. Semiconductor material 337 is then planarized by a process such as CMP to produce the structure of FIG. 5H where reference numeral 338 refers to the planarized semiconductor material derived from layer 337. The structure of FIG. 5H is then further planarized to form the planar hybrid orientation structure 339 of FIG. 5I.

In view of the difficulties and limitations described above, there is still a need for providing planar hybrid orientation substrates by ATR methods which (i) exploit the benefits of in-place bonding techniques, and (ii) avoid or minimize the formation of a crystalline damaged layer during the amorphization step, thereby allowing the formation of lower-defectivity hybrid orientation substrates.

SUMMARY OF THE INVENTION

The present invention provides a method of forming a hybrid orientation substrate by combining the in-place bonding methods described in U.S. application Ser. No. 10/978,551 (the content of which is incorporated herein by reference) with an ATR method which has been modified from the ATR method described in U.S. application Ser. No. 10/725,850. In the ATR method disclosed in the '850 application, selected-area amorphization was performed after formation of the bilayer template structure. In the present method, the selected area amorphization is performed before formation of the final bilayer template structure, while the upper and lower semiconductor layers are still separated by a sacrificial spacer layer. The implant energy and dose are then designed so that the highly damaged crystalline region-normally occurring at the boundary between amorphous and undamaged crystalline regions falls within the sacrificial layer, with fully amorphized semiconductor material on one side of the sacrificial layer and relatively undamaged regions of template-quality semiconductor material on the other. In-place bonding is performed after amorphization. This removes the sacrificial layer, leaving a structure in which the amorphized regions on one side of the bonded interface are in direct contact with the defect-free crystalline semiconductor material on the other.

The present method for forming hybrid orientation substrates thus incorporates the following sequence of steps to change the orientation of selected semiconductor regions from an original orientation to a desired orientation:

selecting a substrate comprising a first single crystal semiconductor layer having a first crystal orientation and a second single crystal semiconductor layer having a second crystal orientation different from the first, wherein the first and second semiconductor layers are separated by a sacrificial spacer layer;

amorphizing selected areas of the first semiconductor layer or second semiconductor layer (by ion implantation through a mask, for example) to form localized amorphized regions;

performing an in-place bonding process to bring the first and second semiconductor layers into direct contact at a bonded interface; and recrystallizing the localized amorphized regions across the bonded interface, using the semiconductor on the non-amorphized side of the bonded interface as a template, thereby changing the orientation of the semiconductor in the localized amorphized regions from its original orientation to a desired orientation.

The basic method of the invention has two main embodiments. In the first, selected area amorphization is performed on the upper semiconductor layer and the lower layer provides the template for recrystallization. In the second (useful when the lower semiconductor layer is disposed on an insulator), the selected area amorphization is performed on the lower semiconductor layer and the upper layer provides the template for recrystallization.

With the first embodiment of top amorphization and bottom templating, amorphization can proceed without EOR damage to the substrate semiconductor layer because the EOR damage is absorbed by the sacrificial spacer layer. With the second embodiment of top templating and bottom amorphization, amorphization will leave beginning-of-range defects primarily in the sacrificial spacer layer. In both cases, the in-place bonding will leave a sharp interface between the amorphized semiconductor and the templating crystalline semiconductor, and the templating semiconductor will largely be free of defects. If desired, some annealing may be performed prior to in-place bonding to heal beginning-of-range defects in the upper semiconductor layer, and/or to slightly densify the amorphized regions. While the conditions for this pre-crystallization annealing must be mild enough to avoid spontaneous crystallization of the amorphized regions, there is no problem with annealing at the lower (but still elevated) temperatures at which templated recrystallization would occur, since amorphized and templating layers are not yet in direct contact.

This basic method may be adapted in whole or in part to form planar hybrid orientation semiconductor structures on a variety of substrates or substrate layers, including bulk semiconductors, thin or thick insulating layers, and insulating (or high resistivity) substrates. Different planar hybrid orientation substrates will typically require different starting substrates. Single layer semiconductor-on-insulator (SOI) substrates would typically be the starting substrates for forming a bulk planar hybrid orientation substrates, whereas a double layer SOI substrate would typically be the starting substrate for forming a SOI planar hybrid orientation substrate.

It should be noted that the hybrid orientation substrates provided by the methods of this invention are referred to as planar because the top surfaces of differently oriented semiconductor regions lie in the same horizontal plane. True planarity would typically be achieved by depositing one or more insulating layers on the "planar" hybrid orientation substrate to fill and overfill any topography, and then planarizing by a process such as chemical mechanical polishing (CMP).

As discussed above in connection with the description of the prior art ATR methods, additional processing steps may be incorporated into the basic method to minimize the possibility of lateral templating. In addition, "Separation by Implantation of Oxygen" (SIMOX) processes such as those described in U.S. application Ser. No. 10/725,850 and U.S. application Ser. No. 10/902,557, "Dual SIMOX hybrid orientation technology (HOT) substrates," may be used to create buried insulating layers (or thicken existing buried insulator layers) in the planar hybrid orientation substrates created by the methods of this invention to produce hybrid orientation SOI substrates. Other additional processing steps and variations (for example, utilizing various hard mask layers that may be removed before or after bonding, and/or before or after implantation; extension of the method to more than two orientations) may also be added without departing from the basic method of the invention.

In another embodiment of the invention, a layer comprising crystalline semiconductor regions having a first crystal orientation and amorphous semiconductor regions is formed on top of a sacrificial layer disposed on an underlying semiconductor having a second crystal orientation. After in-place bonding, the amorphous regions are converted into crystalline regions having the crystal orientation of the underlying semiconductor.

In a variation of this embodiment, a layer comprising single crystal semiconductor regions of a first semiconductor material and amorphous semiconductor regions of a second semiconductor material is formed on top of a sacrificial layer disposed on an underlying single crystal semiconductor of the second semiconductor material. After in-place bonding, the amorphous regions are converted into single crystal regions having crystal orientation of the underlying semiconductor.

It is envisioned that the hybrid orientation substrates produced by the methods of this invention would be further processed with methods known in the art to form planar hybrid orientation substrates with semiconductor devices and/or integrated circuits thereupon.

BRIEF DESCRIPTION OF THE DRAWINGS

These and other features, aspects, and advantages will be more readily apparent and better understood from the following detailed description of the invention, in which:

FIGS. 5A–5I show, in cross section view, how the steps of FIG. 4 could be modified and combined with a variation of a prior art epitaxial growth method to from a planar hybrid orientation substrate;

FIGS. 6A–6H outline, in cross section view, the steps of a first embodiment of the present invention in which a bulk hybrid orientation substrate is formed using a "top amorphization/bottom templating" method;

FIGS. 7A–7H show, in cross section view, minor variations of the FIG. 6 method for forming bulk hybrid orientation substrates;

FIGS. 9A–9M outline, in cross section view, the steps of a second embodiment of the invention in which a semiconductor-on-insulator hybrid orientation substrate is formed using a "bottom amorphization/top templating" method;

FIGS. 10A–10J outline, in cross section view, a "no-amorphization" variation of the methods of the present invention for forming planar hybrid orientation substrates.

DETAILED DESCRIPTION OF THE INVENTION

Figure 1A:
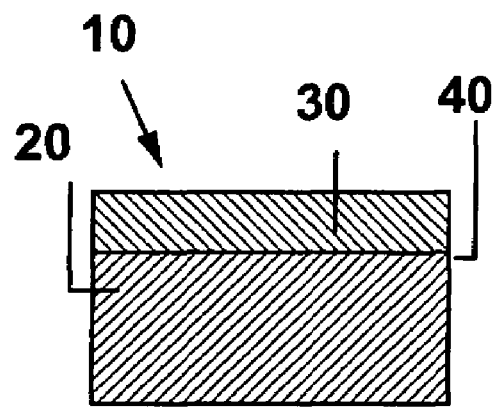
FIGS. 1A–1C outline, in cross section view, the steps of one prior art ATR method for forming a bulk semiconductor hybrid orientation substrate.
Figures 1B, 1C:
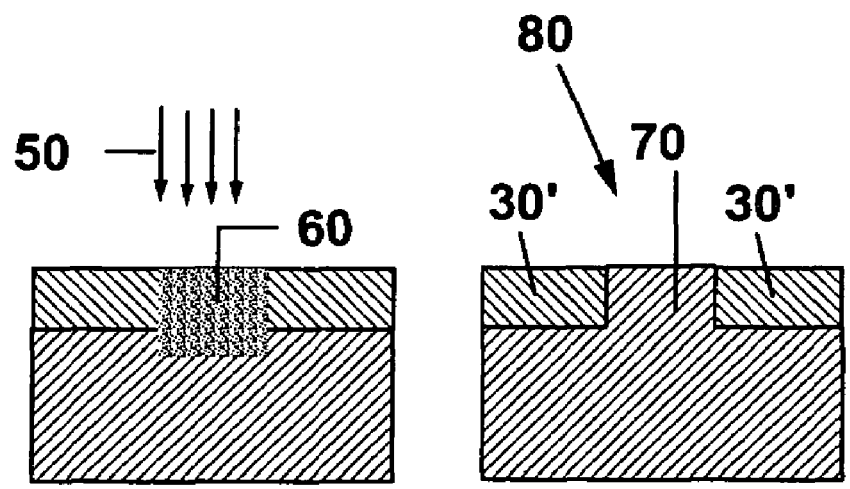
Figure 2A:
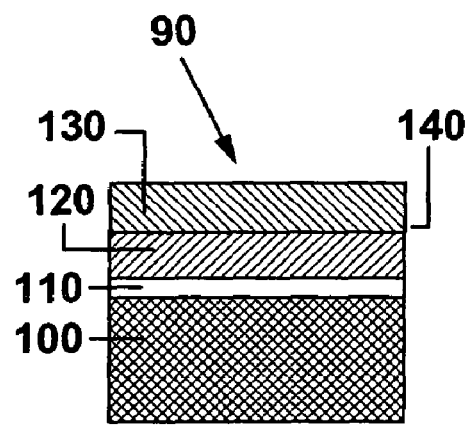
FIGS. 2A–2D outline, in cross section view, the steps of one prior art ATR method for forming a SOI hybrid orientation substrate.
Figure 2B:
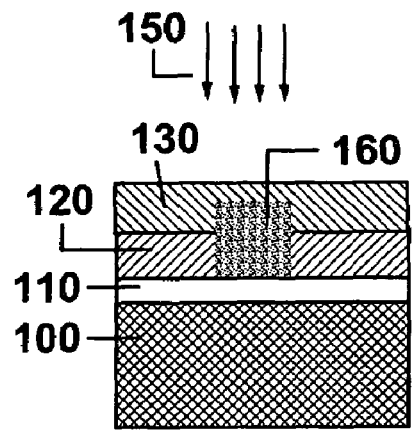
Figure 2C:
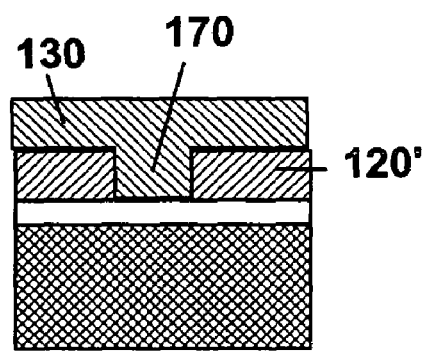
Figure 2D:
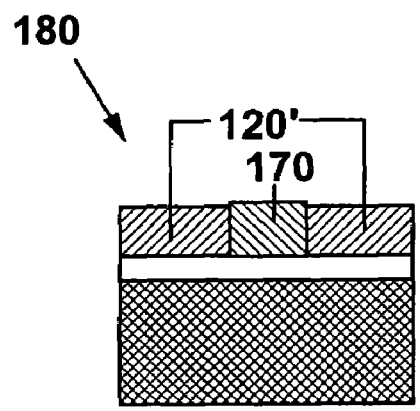
Figure 3A:
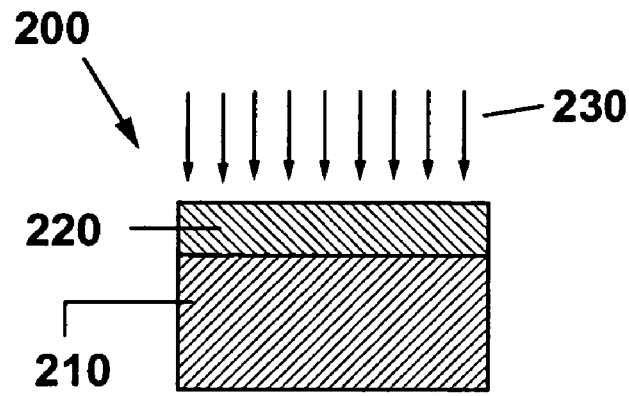
FIGS. 3A–3C show, in a schematic cross section view, the various damaged regions and defects that can result from prior art ATR methods.
Figure 3B:
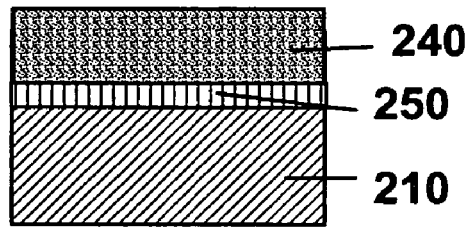
Figure 3C:
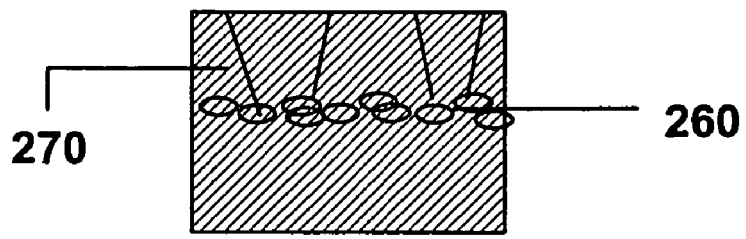
Figures 4A, 4B, 4C:
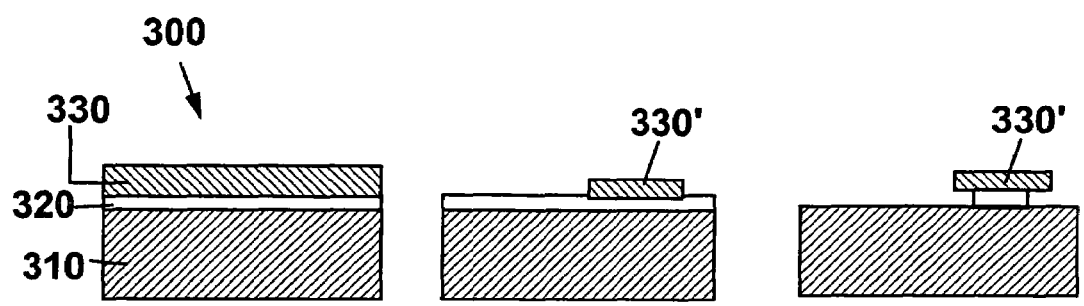
FIGS. 4A–4E outline, in cross section view, the basic steps of a prior art in-place bonding method for forming a hybrid orientation substrate.
Figures 4D, 4E:
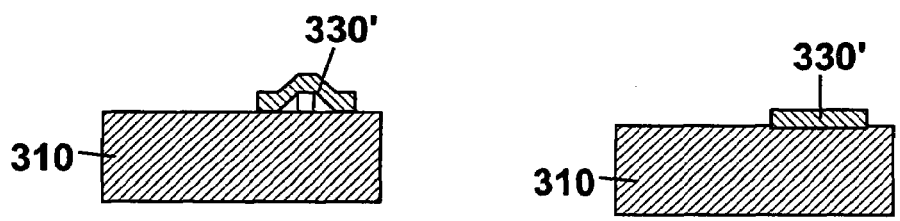

The present invention, which provides methods of fabricating planar hybrid-orientation substrate structures, will now be described in greater detail by referring to the drawings that accompany the present application. The drawings that accompany the present application are provided for illustrative proposes and thus they are not drawn to scale. In the drawings, which illustrate the process flows of the present invention, reference numbers are not shown for materials (or areas) that are not be affected by the specified processing step. It is understood then that the materials not labeled in a particular step have not changed from the proceeding step(s). Also, in the drawings, like and/or corresponding materials are described with like reference numerals.

As mentioned above, the methods of the present invention share the following basic steps of: selecting a starting substrate comprising a first single crystal semiconductor layer having a first crystal orientation overlying a second single crystal semiconductor layer having a second crystal orientation different from the first, wherein the first and second semiconductor layers are separated by a sacrificial spacer layer; amorphizing selected areas of first or second semiconductor layer (by ion implantation through a mask, for example) to form localized amorphized regions; using an in-place bonding process to bring first and second semiconductor layers into direct contact at a bonded interface; and recrystallizing the localized amorphized regions across the bonded interface, using the semiconductor on the non-amorphized side of the bonded interface as a template, thereby changing the orientation of the semiconductor in the localized amorphized regions from its original orientation to a desired orientation.

FIGS. 6A–6H show, in cross section view, the steps of a first embodiment of the present invention in which a bulk hybrid orientation substrate is formed using a "top amorphization/bottom templating" method. Specifically, FIG. 6A shows starting substrate 350 comprising first, upper single crystal semiconductor layer 360 having a first orientation overlying a second, lower single crystal semiconductor layer 370 having a second orientation different from the first, wherein upper and lower semiconductor layers 360 and 370 are separated by sacrificial spacer layer 380. Layer 360 is then patterned into semiconductor features 390, exposing regions of sacrificial spacer 380, as shown in FIG. 6B.

One or more features 390 are then subjected to ion bombardment (typically ion implantation) 400 to create amorphized semiconductor features 410, as shown in FIG. 6C. There is no end-of-range damage to semiconductor layer regions 420 under amorphized feature 410 because the implant's end-of-range (shown as line 430) is designed to fall within sacrificial spacer layer 380.

The progression of in-place bonding/sacrificial spacer layer removal (typically performed in an aqueous solution containing hydrofluoric acid) is shown in FIGS. 6D–6F. In FIG. 6D, the material of spacer layer 380 is gone from the regions between features 390 and 410, and is just starting to etch under (or "undercut") the edges of features 390 and 410. As the etch continues, the edges of semiconductor features 390 and 410 start to bond to lower semiconductor layer 370, as shown in FIG. 6E. The in-place bonding process is complete when semiconductor features 390 and 410 are fully in contact with lower semiconductor layer 370, as shown in FIG. 6F.

If desired, amorphized semiconductor features 410 may be annealed prior to the in-place bonding to improve their resistance to the etching solution used for removal of the sacrificial spacer layer. The annealing may be performed under any time/temperature conditions that do not lead to spontaneous recrystallization (i.e., non-templated recrystallization into polycrystalline material). Since the amorphized material is not in contact with a templating semiconductor surface, the allowable conditions include those at which one would ordinarily see rapid templated recrystallization.

The structure of FIG. 6F is then subjected to a recrystallization anneal to produce the structure 440 of FIG. 6G with semiconductor feature(s) 390 retaining their original orientation and recrystallized feature(s) 450 taking on the crystal orientation of lower semiconductor layer 370. The surface of structure 440 has a topography comprising high regions (the top surfaces of features 390 and 450) and low regions 460 between them. The planar structure of FIG. 6H is produced by the steps of filling and overfilling the topography of structure 440 with dielectric material 470 which is then planarized by removing the overfill. This planarization is typically effected by chemical mechanical polishing, but other methods may be used as well.

While it is preferred that the dielectric fill/overfill and planarization steps be performed after the recrystallization step shown in FIG. 6G, they may in principle be performed immediately before the recrystallization step shown in FIG. 6G.

FIGS. 7A–7H show minor variations of the FIG. 6 method for forming bulk hybrid orientation substrates. FIGS. 7A–7C show how the order of the patterning and selected area amorphization steps may be reversed. Specifically, FIG. 7A shows starting substrate 350 of FIG. 6A; FIG. 7B shows selected area amorphization of upper semiconductor layer 360 to form amorphized region 360', and FIG. 7C shows layer 360 containing amorphized regions 360' after patterning into different features such as, for example, crystalline semiconductor features 390 and amorphized semiconductor features 410. As was the case with the FIG. 6 process flow, there is no end-of-range damage to semiconductor layer regions 420' under amorphized region 360'because the implant's end-of-range (shown as line 430') is designed to fall within sacrificial spacer layer 380.

The patterning of layer 360 (with or without amorphized regions 360') would typically be performed by forming and then etching through a patterned mask, using a process such as reactive ion etching (RIE). This etch is shown in FIGS. 6B and 7C as stopping on sacrificial spacer layer 380. However, the etch may extend through the sacrificial layer (as shown in FIG. 7D) or even into substrate 370 to form trenches (as shown in FIG. 7E). The mask for the etch may be a photoresist, a hard mask material (such as an oxide or nitride, for example), or a combination of a photoresist and a hard mask. Hard mask layers, if present, may be removed before the in-place bonding steps, during the in-place bonding steps, or after the in-place bonding steps, depending on the process flow desired.

The process steps required to complete the structure of FIG. 7E are shown in FIGS. 7F–7H. Specifically, FIG. 7F shows the structure of FIG. 7E after in-place bonding; FIG. 7G shows the structure of FIG. 7F after recrystallization, and FIG. 7H shows the structure of FIG. 7G after dielectric fill/overfill and planarization. If desired, the dielectric fill/overfill and planarization steps may be preceded by an etch step to remove selected regions of recrystallized semiconductor 450 (for example, imperfectly crystallized edge regions like those that have been seen after recrystallization of ion-implant-amorphized silicon regions bordered by oxide-filled trenches [N. Burbure and K. S. Jones, "The effect of oxide trenches on defect formation and evolution in ion-implanted silicon," Mat. Res. Soc. Symp. Proc. 810 C4.19.1 (2004)]).

Figure 8A:
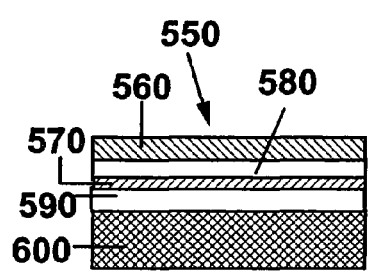
FIGS. 8A–8I show, in cross section view, how the "top amorphization/bottom templating" method of FIG. 6 might be used to form a semiconductor-on-insulator hybrid orientation substrate.
Figure 8B:
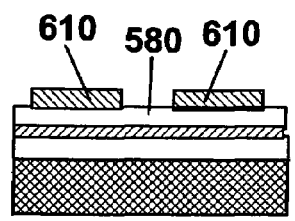

For certain device applications, however, it would be desirable to have planar SOI hybrid orientation substrates rather than planar bulk hybrid orientation substrates. FIGS. 8A–8I show how the "top amorphization/bottom templating" method described in connection with FIGS. 6 and 7 might be used to form a SOI hybrid orientation substrate. Specifically, FIG. 8A shows starting substrate 550 comprising first, upper single crystal semiconductor layer 560 having a first orientation overlying a second, lower single crystal semiconductor-on-insulator layer 570 having a second orientation different from the first, wherein upper and lower semiconductor layers 560 and 570 are separated by sacrificial spacer layer 580, and semiconductor-on-insulator layer 570 is disposed on insulator layer 590 on substrate 600. FIG. 8B shows upper semiconductor layer 560 after patterning into semiconductor features 610, exposing regions of sacrificial spacer 580.

Figure 8C:
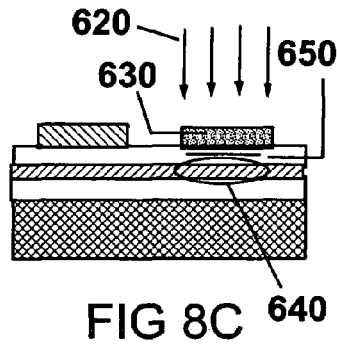

One or more features 610 are then subjected to ion bombardment (typically ion implantation) 620 to create amorphized semiconductor features 630, as shown in FIG. 8C. There is no end-of-range damage to semiconductor layer regions 640 under amorphized feature 630 because the implant's end-of-range (shown as line 650) is designed to fall within sacrificial spacer layer 580.

Figure 8D:
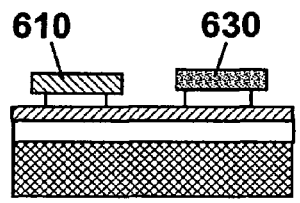
Figure 8E:
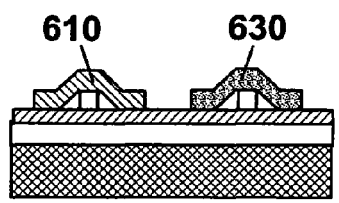
Figure 8F:
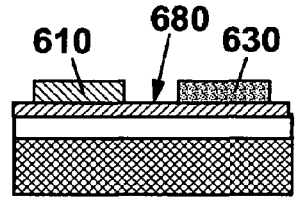

The progression of in-place bonding/sacrificial spacer layer removal, analogous to the steps of FIGS. 6D–6F is shown in FIGS. 8D–8F. In FIG. 8D, the material of spacer layer 580 is gone from the regions between features 610 and 630, and is just starting to undercut the edges of features 610 and 630. As the etch continues, the edges of semiconductor features 610 and 630 start to bond to lower semiconductor layer 570, as shown in FIG. 8E. The in-place bonding process is complete when semiconductor features 610 and 630 are fully in contact with lower semiconductor layer 570, as shown in FIG. 8F.

Figure 8G:
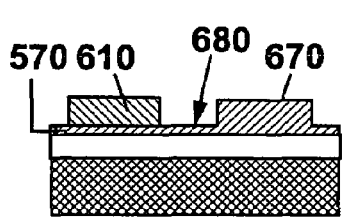
Figure 8H:
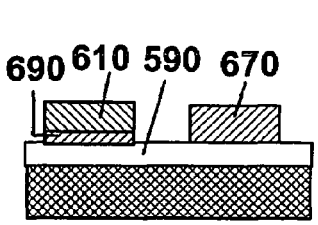

The structure of FIG. 8F is then subjected to a recrystallization anneal to produce the structure of FIG. 8G with semiconductor feature(s) 610 retaining their original orientation and recrystallized feature(s) 670 taking on the crystal orientation of lower semiconductor layer 570. FIG. 8H shows the structure of FIG. 8G after exposed regions 680 of lower semiconductor 570 are removed to leave residual lower semiconductor feature 690. Exposed regions 680 of lower semiconductor 570 may alternatively be removed prior to the recrystallization step of FIG. 8G. The structure of FIG. 8H is then filled and overfilled with a dielectric, which is then planarized to form the structure of FIG. 8I.

As described earlier in this section, the exact sequence of steps is typically not critical. If desired, the dielectric fill/overfill and planarization steps may be performed prior to the recrystallization step, though preferably not before removal of exposed regions 680 of lower semiconductor 570. Variations such as those described in FIG. 7 may be incorporated into the process flow, and hard mask layers, if present, may be removed before the in-place bonding steps, during the in-place bonding steps, or after the in-place bonding steps. Removal of exposed lower semiconductor regions 680 may be performed by a process such as RIE. Maskless RIE, selective to underlying insulator layer 590, is simple, though possibly damaging to the remaining semiconductor features 610 and 670. Alternatively, one may introduce a new patterned masking layer or reuse hard mask layers left over from the initial patterning process that defined semiconductor features 610.

Figure 8I:
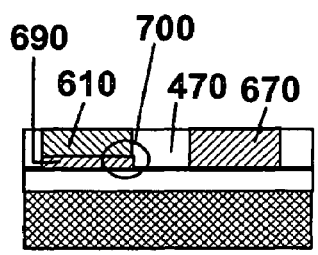

A potential drawback of the FIG. 8 process is highlighted in FIG. 8I. Semiconductor features 610 not undergoing ATR are left in contact with residuals 690 of the lower semiconductor at bonded semiconductor-to-semiconductor interface 700. Bonded interface 700 may interfere with, or cause, degradation in the performance of devices built on these substrates if active regions of the device overlap with, or include, this interface. For example, dopants from source and drain regions of an FET might segregate to and diffuse along interface 700, creating a high conductivity path and elevated source-to-drain leakage currents. In addition, feature 670, now having the second semiconductor orientation, cannot be thinned by etching to a thickness less than that of residual semiconductor feature 690 without removing all of feature 610 with its original first semiconductor orientation (or sacrificing substrate planarity). This is a disadvantage if ultra thin hybrid orientation SOI is required.

Figure 9K:
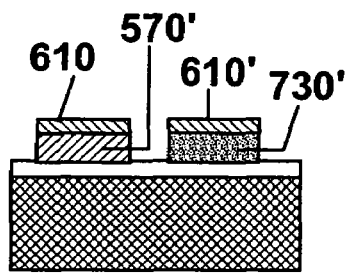

Residual bonded semiconductor-to-semiconductor interface 700 is avoided in a "bottom amorphization/top templating" version of the present invention, as shown in FIGS. 9A–9M. Specifically, FIG. 9A shows starting substrate 550, identical to the starting substrate shown in FIG. 8A. Upper semiconductor layer 560 is again patterned into semiconductor features 610, exposing regions of sacrificial spacer 580, as shown in FIG. 9B.

One or more features 610 are then subjected to ion bombardment (typically ion implantation) 720 to create buried amorphized semiconductor regions 730 and slightly damaged semiconductor features 610', as shown in FIG. 9C. Beginning-of-range damage to semiconductor feature 610' is minimized because the depth (denoted by line 740) at which one would expect to see the transition between undamaged and fully amorphized semiconductor is designed to fall within sacrificial spacer layer 580. (It should be noted that damage to features 610' can be further minimized with the use of a channeling implant aligned to the orientation of semiconductor 610' for ion bombardment 720).

Figure 9L:
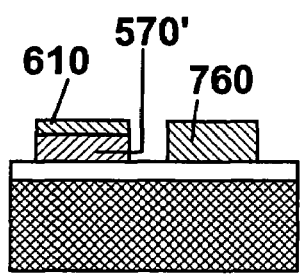

The progression of in-place bonding/sacrificial spacer layer removal, analogous to the steps of FIGS. 6D–6F, is shown in FIGS. 9D–9F. The structure of FIG. 9F is then subjected to a recrystallization anneal to produce the structure of FIG. 9G with semiconductor feature(s) 610 retaining their original orientation and recrystallized feature(s) 760 taking on the crystal orientation of upper semiconductor layer 610'. While FIG. 9G shows this recrystallization being performed prior to removal of exposed regions 770 of lower semiconductor 570, exposed regions 770 may alternatively be removed prior to recrystallization (as shown in FIGS. 9K–9L) to avoid the possibility of lateral templating (i.e., templating from adjacent regions of lower semiconductor layer 570 rather than from overlying regions of upper semiconductor layer feature 610'). However, such precautions may not be necessary if the vertically templated recrystallization rate is much faster than the laterally templated one.

Figure 9M:
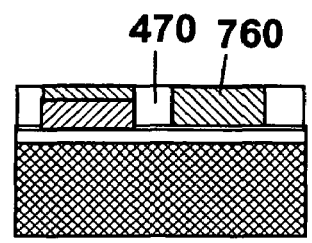

There are several ways to get from the structures of FIGS. 9G and 9L to the structure of FIG. 9M. For example, the structure of FIG. 9G could be planarized by a process such as CMP to produce the structure of FIG. 9H. Undesired regions of lower semiconductor 570 adjacent to recrystallized semiconductor 760' (along with any undesired and/or defective edge regions of semiconductor 760') would then be removed to produce the structure of FIG. 9I, which would then be subjected to the steps of dielectric fill/overfill and planarization to produce the structure of FIG. 9M.

Alternatively, one could get to the structure of FIG. 9M from the structure of FIG. 9K by first subjecting the structure of FIG. 9K to the steps of dielectric fill/overfill and planarization to produce the structure of FIG. 9L, and then using additional polishing (or an oxidation/wet etch process) to remove a top surface layer containing semiconductor feature 610.

Maskless RIE, selective to underlying insulator layer 590, is a simple, though possibly damaging method for producing the structure of FIG. 9I from the structure of FIG. 9G. Alternatively, one may introduce a new patterned masking layer or reuse hard mask layers left over from the initial patterning process that defined semiconductor features 610. And, as was the case with the "top amorphization/bottom templating" methods of FIGS. 6, 7, and 8, amorphized semiconductor features 730 may be annealed prior to the in-place bonding steps to improve their resistance to the etching solution used for removal of the sacrificial spacer layer.

The present invention also provides a variation of the above-described "top amorphization/bottom templating" method for forming planar hybrid orientation substrates. In this variation, no selected area amorphization steps are required. The steps of this "deposited amorphous/bottom templating" method comprise: selecting a starting substrate comprising a first single crystal semiconductor layer having a first crystal orientation overlying a second single crystal semiconductor layer having a second crystal orientation different from the first, first and second semiconductor layers separated by a sacrificial spacer layer; replacing first single crystal semiconductor layer in selected regions with a deposited amorphous semiconductor material, thereby creating regions of deposited amorphous semiconductor material on said spacer layer; using an in-place bonding process to bring remaining regions of first semiconductor layer and regions of deposited amorphous semiconductor material into direct contact with the second semiconductor layer at a bonded interface; and converting the deposited amorphous semiconductor material on the upper side of the bonded interface to a single crystal semiconductor material having the second crystal orientation, using a templated crystallization process wherein the underlying crystalline semiconductor layer having the second crystal orientation acts as the template.

FIGS. 10A–10J show how this deposited amorphous/bottom templating method may be used to form a SOI planar hybrid orientation substrate analogous to the structure of FIG. 8I from starting substrate structure 550 of FIG. 8A. Note that similar processing may likewise be used to form a bulk planar hybrid orientation substrate analogous to the structure of FIG. 6H from starting substrate structure 350 of FIG. 6A. FIG. 10A shows starting substrate 550 of FIG. 8A comprising first, upper single crystal semiconductor layer 560 having a first orientation overlying a second, lower single crystal semiconductor-on-insulator layer 570 having a second orientation different from the first, wherein upper and lower semiconductor layers 560 and 570 are separated by sacrificial spacer layer 580, and semiconductor-on-insulator layer 570 is disposed on insulator layer 590 on substrate 600.

FIG. 10B shows upper semiconductor layer 560 after it has been patterned with hard mask structures 770 to form semiconductor features 610 and expose regions of sacrificial spacer 580. Hard mask features 770 are preferably formed from an insulating material such as $SiO_2$ or silicon nitride. FIG. 10C shows the structure of FIG. 10B after formation of sacrificial sidewall spacers 780, preferably formed from an insulating material such as $SiO_2$ or silicon nitride. Cavity 800 between sidewall spacers 780 is then filled and overfilled with amorphous semiconductor material 810 to produce the structure of FIG. 10D. Amorphous semiconductor material 810, which may have a composition which is the same or different from semiconductor 560, is then planarized by a process such as CMP to produce the structure of FIG. 10E with amorphous semiconductor feature 810' situated between sidewall spacers 780. Amorphous semiconductor material 810 might be deposited by processes such as chemical vapor deposition (CVD) or sputtering and might comprise, for example, amorphous silicon (a-Si) or amorphous germanium (a-Ge).

Crystalline semiconductor features 610 and amorphous semiconductor feature 810' are then bonded to SOI layer 570 by in-place bonding, as shown in FIGS. 10F and 10G. The structure of FIG. 10G is then subjected to a crystallization anneal to produce the structure of FIG. 10H with semiconductor feature(s) 610 retaining their original orientation and originally amorphous feature 810' crystallizing into feature(s) 820 having the crystal orientation of lower semiconductor layer 570. FIG. 10I shows the structure of FIG. 10H after exposed regions 830 of lower semiconductor 570 are removed to leave residual lower semiconductor feature 690. Exposed regions 830 of lower semiconductor 570 may alternatively be removed prior to the crystallization step of FIG. 10H. The structure of FIG. 10I is then filled and overfilled with a dielectric, which is then planarized to form the structure of FIG. 10J.

The method discussed in FIGS. 10A–10J has several advantages over the methods where amorphization is used. First, the method eliminates the ion bombardment and the ion-blocking mask required to protect areas, which should not be amorphized. Second, the sacrificial layer 580 can be made very thin since it does not need to contain the end of range damage from the implant. Third, the etch rate of the sacrificial layer 580 is similar under amorphized and crystalline features since it was not modified by an implant. Fourth, amorphous layer 810 does not need to be of the same material as layer 560, thus enabling fabrication of mixed-material planar hybrid orientation substrates. For example, second, lower semiconductor layer 570 and amorphous semiconductor 810 may have the same composition (e.g., crystalline Ge and amorphous Ge), where said same composition is different from the composition of the first, upper single crystal semiconductor layer 560 (e.g., crystalline Si), thus providing a planar hybrid orientation mixed-material substrate with crystalline surface regions of two different materials (e.g., Ge and Si). For cases in which a mixed-material, single orientation substrate is preferred, semiconductor layers 560 and 580 may be selected to have the same orientation.

As described in connection with the other process flows of this invention, the exact sequence of certain steps is frequently not critical. Variations such as those described in FIGS. 7 and 9 may be incorporated into the process flow, and hard mask layers, if present, may be removed before the in-place bonding steps, during the in-place bonding steps, or after the in-place bonding steps, depending on the process flow desired. Removal of exposed regions 770 may be performed by a process such as RIE.

When choosing a process flow and starting substrate structure, it should be kept in mind that different semiconductor orientations can have different recrystallization rates as well as different defect levels in the recrystallized material. The orientation into which the amorphized or amorphous regions will be transformed is preferably selected to be the one which has the easiest growth and lowest defectivity. With this approach, the layer with the easier-to-recrystallize orientation provides the template layer; some regions of the semiconductor layer with the harder-to-recrystallize orientation would keep their original orientation, while others would be amorphized (or replaced with amorphous semiconductor material) and converted into the easier-to-recrystallize orientation. For the case of Si, it would thus be preferable to convert selected regions of 110-oriented Si into 100-oriented Si rather than the reverse.

The substrates and single crystal semiconductor layers of the present invention may be selected from a wide range of semiconductor materials. For example, substrate 600 (if a semiconductor) and differently oriented first and second semiconductor layers 360, 370, 560, and 570 may be selected from the group including Si, SiC, SiGe, SiGeC, Ge alloys, Ge, C, GaAs, InAs, InP as well as other III–V or II–VI compound semiconductors. Layered combinations or alloys of the aforementioned semiconductor materials (for example, Si layers on SiGe), with or without one or more dopants, are also contemplated herein. First and second semiconductor regions may be strained, unstrained, or a combination of strained and unstrained layers can be used. For Si-containing semiconductor layers, the crystallographic orientations would typically be selected from the group including (110), (111), and (100). Preferred choices of first and second semiconducting layer for the structures of FIGS. 5 and 8 might comprise 100-oriented Si for layers 370 and 560 and 110-oriented Si for layers 390 and 570.

The thickness of first and second single crystal semiconductor regions 360, 560, and 570 is typically from about 1 to about 500 nm, with a thickness from about 10 to about 100 nm being more typical. The thickness of semiconductor layer 370 and substrate 600 would typically be between 5 and 1000 μm, and most typically be about 600 μm.

Buried insulator layer 590 (and substrate 600, if insulating) may be selected from a wide range of dielectric materials, including, but not limited to the group including $SiO_2$, crystalline $SiO_2$, $SiO_2$ containing nitrogen or other elements, silicon nitrides, metal oxides (e.g., $Al_2O_3$), insulating metal nitrides (e.g., AlN), highly thermally conductive materials such as crystalline diamond. Buried insulating thicknesses may range from about 2 nm to about 500 nm, with preferable thicknesses typically being in the range from about 50 to about 150 nm.

Starting substrate structures (e.g., substrate structures 350 of FIGS. 6A and 7A, and 550 of FIGS. 8A and 9A) may be formed by any method or combination of methods known to those skilled in the art, for example, hydrophilic bonding methods described by Q. Y. Tong et al. or the SIMOX methods described in U.S. application Ser. No. 10/902,557.

As discussed in U.S. application Ser. No. 10/725,850, selected area amorphization would typically be effected by ion implantation. The optimum ion implantation conditions, the species, ion energy, dose, tilt and twist angle, temperature, number and sequence of implants, etc. will depend on the structure of the starting substrate, the materials and thicknesses of the semiconductor layers, and the position (upper or lower) of the semiconductor layer being amorphized. Any ion species known to those skilled in the art may be used for the amorphization. Typically the implanted species would comprise at least one element selected from the group including but not limited to: Si, Ge, Ar, C, O, N, H, He, Kr, Xe, P, B, As, and the like. Si or Ge are preferred implantation species when Si is the semiconductor material being amorphized. Lighter ions such as H and He are typically less effective at amorphization. Ion implantation may be performed at temperatures ranging from cryogenic (77K or lower) to several hundred degree Celsius (e.g., 500° C.). However, it should be noted that the implant dose required for amorphization increases with temperature, and that implantation temperatures below 50° C. would typically be preferred for all "top amorphiztion/bottom templating" process flows.

Regions not being amorphized would typically be protected from ion implantation by a patterned mask (for example, a patterned photoresist for a room temperature implantation process). Implants may be performed with or without "screen oxide" layers and may be performed with multiple implants at different energies if a sufficiently uniformly amorphized region cannot be easily achieved with a single implant. For example, Si implanted at cryogenic temperatures at 50, 100, 150, and 200 keV with a total dose of $6E15/cm^2$ was found to be sufficient to amorphize the top 400 nm of 100-oriented and 110-oriented Si. See, for example, L. Csepregi et al., J. Appl. Phys. 49 3096 (1978). However, much lower doses (for example, $5E14/cm^2$ at 40 keV) can amorphize Si when the implanted ion is Ge and surface region to be amorphized is thinner than 50–100 nm.

As discussed in U.S. application Ser. No. 10/725,850, recrystallization of localized amorphous regions is typically effected by annealing at temperatures from about 200° to about 1300° C., preferably from about 400° to about 900° C., and more preferably from about 450° and 650° C., for a time period sufficient to bring about the desired recrystallization. This time period will depend on the orientation of the template layer, on the thickness of the amorphized region to be recrystallized, and on the presence of implanted and other impurities in the amorphized layer. Annealing may be performed in a furnace or by rapid thermal annealing. In other embodiments, annealing may be performed using a laser anneal or a spike anneal. The annealing ambient would typically be selected from the group of gases including $N_2$, Ar, He, $H_2$ and mixtures containing any of these gases. Additional post-recrystallization anneals (typically at the high end of the temperature range mentioned above) may also be performed after the initial recrystallization anneal to reduce the defectivity and/or improve the quality of the recrystallized material.

Any conventional combination of ion implantation and annealing steps may be employed following recrystallization to create a buried insulator layer (or to extend an existing buried insulator layer). For example, any conventional SIMOX process can be used to add a buried oxide layer to the structures shown in FIGS. 5H and 6G, or extend the buried oxide upwards to obliterate seam 700 in structures such as that shown in FIG. 7I (see for example, U.S. application Ser. Nos. 10/725,850 and 10/902,557).

Figure 11:
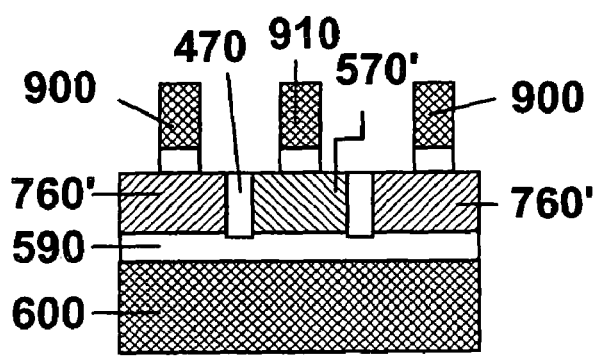
FIG. 11 shows, in cross section view, how devices such as field effect transistors might be disposed on the substrates made by the methods of this invention.

FET devices of FIG. 11, including pFETs 900 and nFETs 910, may be fabricated on the hybrid orientation substrate structures shown in FIG. 8J using techniques that are well known to those skilled in the art. Similarly, FETs may be formed on the substrates shown in FIGS. 6H, 7H, and 8I. In a typical embodiment, pFET devices 900 would be fabricated atop the 110-oriented semiconductor regions and the nFET devices 910 would be fabricated atop the 100-oriented semiconductor regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a planar hybrid orientation substrate comprising:
    selecting a starting substrate comprising a first single crystal semiconductor layer having a first crystal orientation overlying a second single crystal semiconductor layer having a second crystal orientation different from the first, said first and second semiconductor layers separated by a sacrificial spacer layer;
    performing a selected area amorphization on one of said first or second semiconductor layers to form localized amorphized regions in said semiconductor layer;
    performing in-place bonding to bring said first and second semiconductor layers into direct contact at a bonded interface; and
    recrystallizing the localized amorphized regions across the bonded interface, using the semiconductor on the non-amorphized side of the bonded interface as a template, thereby changing the orientation of the semiconductor in the localized amorphized regions from its original orientation to a desired orientation.

2. The method of claim 1 further comprising patterning said first semiconductor layer prior to in-place bonding, said patterning exposing said sacrificial layer.

3. The method of claim 2 wherein said patterning of said first semiconductor layer is performed prior to said selected area amorphization.

4. The method of claim 2 wherein said patterning of said first semiconductor layer is performed after said selected area amorphization.

5. The method of claim 2 wherein said step of patterning said first semiconductor layer includes the step of forming a patterned a hard mask layer which is present at the start said in-place bonding.

6. The method of claim 2 wherein said patterning step includes etching into said second semiconductor layer.

7. The method of claim 1 wherein said localized amorphized region is formed predominately within the first, upper single crystal semiconductor layer.

8. The method of claim 1 wherein said localized amorphized region is formed predominately within the second, lower single crystal semiconductor layer.

9. The method of claim 1 further comprising forming, prior to recrystallization, at least one trench isolation region to separate regions of said semiconductor selected for amorphization from regions of the same said semiconductor not selected for amorphization.

10. The method of claim 1 further comprising additional planarization steps after said in-place bonding, said planarization steps including filling and overfilling any topography with a dielectric material and planarizing said dielectric material by removing the overfill.

11. The method of claim 10 further comprising removing semiconductor material in selected areas to create additional or deeper topography prior to said fill/overfill step.

12. The method of claim 1 wherein said second, lower single crystal semiconductor layer is disposed on the insulating layer of a semiconductor-on-insulator substrate.

13. The method of claim 1 further comprising forming at least one nFET device and at least one pFET device, wherein said at least one nFET device is located on a crystal orientation that is optimal for said device said at least pFET device is located on a crystal orientation that is optimal for said device.

14. The method of claim 1 further comprising forming or extending a buried insulating layer after said recrystallization step.

15. The method of claim 14 wherein said buried insulating layer is at least partially formed by a separation-by-ion implantation of oxygen (SIMOX) process.

16. The method of claim 1 wherein said amorphization is effected by ion implantation.

17. The method of claim 1 wherein said recrystallizing is performed at a temperature from about 200° C. to about 1300° C.

18. A method of forming a planar hybrid-orientation substrate comprising:
    selecting a starting substrate comprising a first single crystal semiconductor layer having a first crystal orientation overlying a second single crystal semiconductor layer having a second crystal orientation different from the first, first and second semiconductor layers separated by a sacrificial spacer layer;
    replacing first single crystal semiconductor layer in selected regions with a deposited amorphous semiconductor material, thereby creating regions of deposited amorphous semiconductor material on said spacer layer;
    performing in-place bonding to bring remaining regions of first semiconductor layer and regions of deposited amorphous semiconductor material into direct contact with the second semiconductor layer at a bonded interface; and
    converting the deposited amorphous semiconductor material on the upper side of the bonded interface to a single crystal semiconductor material having the second crystal orientation, using a templated crystallization process wherein the underlying crystalline semiconductor layer having the second crystal orientation acts as the template.

19. The method of claim 18 wherein said deposited amorphous semiconductor material has a composition different from that of said first single crystal semiconductor layer.

* * * * *